US011686696B2

(12) United States Patent
Bergstedt et al.

(10) Patent No.: US 11,686,696 B2
(45) Date of Patent: Jun. 27, 2023

(54) FLUID SENSE CIRCUIT WITH VARIABLE SENSITIVITY

(71) Applicant: Funai Electric Co., Ltd., Osaka (JP)

(72) Inventors: Steven W. Bergstedt, Lexington, KY (US); Patricia A. Clore, Lexington, KY (US)

(73) Assignee: Funai Electric Co., Ltd.

( * ) Notice: Subject to any disclaimer, the term of this patent is extended or adjusted under 35 U.S.C. 154(b) by 127 days.

(21) Appl. No.: 17/447,478

(22) Filed: Sep. 13, 2021

(65) Prior Publication Data

US 2023/0077341 A1    Mar. 16, 2023

(51) Int. Cl.
*G01N 27/07* (2006.01)
*G01R 27/22* (2006.01)
*B41J 2/175* (2006.01)

(52) U.S. Cl.
CPC .............. *G01N 27/07* (2013.01); *B41J 2/175* (2013.01); *G01R 27/22* (2013.01)

(58) Field of Classification Search
CPC ..... G01N 27/07; G01R 27/22; B41J 2/17566; B41J 2/175; B41J 2/17543; B41J 2/0451; B41J 2/04555; B41J 2/0458; B41J 2/04571; B41J 2/14153; B41J 2002/14354; Y10T 436/2575; B01L 3/0268
See application file for complete search history.

(56) References Cited

U.S. PATENT DOCUMENTS

| 5,072,235 A * | 12/1991 | Slowik | B41J 2/19 347/92 |
| 6,084,605 A * | 7/2000 | Yaji | B41J 2/17566 347/19 |
| 6,185,515 B1 * | 2/2001 | Froger | B41J 2/17566 347/14 |
| 6,652,053 B2 * | 11/2003 | Imanaka | B41J 2/0458 347/7 |
| 6,871,925 B2 * | 3/2005 | Yamamoto | B41J 2/17566 347/19 |
| 7,631,953 B2 * | 12/2009 | Bergstedt | B41J 2/04521 347/57 |
| 8,113,611 B2 * | 2/2012 | Bergstedt | B41J 2/0458 347/57 |
| 8,567,903 B2 * | 10/2013 | Nishida | B41J 2/16523 347/36 |
| 8,690,280 B2 * | 4/2014 | Nakano | B41J 2/17546 347/50 |

(Continued)

FOREIGN PATENT DOCUMENTS

| CA | 2768790 A1 * | 3/2012 | .......... B41J 2/17513 |
| CN | 103702838 A * | 4/2014 | .......... B41J 2/04501 |

(Continued)

*Primary Examiner* — Patrick Assouad
*Assistant Examiner* — Sean Curtis
(74) *Attorney, Agent, or Firm* — Luedeka Neely Group, PC (57) ABSTRACT

A fluid dispensing system with a fluid cartridge having a fluid reservoir and an ejection head. The ejection head has fluid ejectors that are in fluid flow communication with the fluid reservoir. A fluid detection circuit is electrically connected to at least one of the fluid ejectors. The fluid detection circuit is configured to detect and characterize a fluid in the fluid ejector, where the fluid detection circuit characterizes the resistivity of the fluid by adjusting an ejector voltage of the at least one of the fluid ejectors.

17 Claims, 10 Drawing Sheets

(56) References Cited

U.S. PATENT DOCUMENTS

| | | | | |
|---|---|---|---|---|
| 8,807,675 B2* | 8/2014 | Shindo | | B41J 2/16523 347/7 |
| 8,870,322 B2* | 10/2014 | Martin | | B41J 2/14153 347/14 |
| 8,899,709 B2* | 12/2014 | Govyadinov | | B41J 2/0451 347/14 |
| 9,452,604 B2* | 9/2016 | Van Brocklin | | B41J 2/0458 |
| 9,493,002 B2* | 11/2016 | Edelen | | B41J 2/14072 |
| 9,533,302 B2* | 1/2017 | Edelen | | B01L 3/0268 |
| 10,099,477 B2* | 10/2018 | Edelen | | B41J 2/0458 |
| 10,308,035 B2* | 6/2019 | Van Brocklin | | B41J 2/125 |
| 10,717,279 B2* | 7/2020 | Edelen | | B41J 2/14153 |
| 11,090,938 B1* | 8/2021 | DeBoard | | B41J 2/04535 |
| 2002/0189326 A1* | 12/2002 | Jang | | G01M 3/002 73/40 |
| 2008/0204493 A1* | 8/2008 | Benjamin | | B41J 2/0455 347/11 |
| 2010/0123758 A1* | 5/2010 | Bergstedt | | B41J 2/04541 347/61 |
| 2012/0056921 A1* | 3/2012 | Nakano | | B41J 2/1752 347/1 |
| 2013/0236374 A1* | 9/2013 | Edelen | | B01L 3/0293 422/502 |
| 2016/0297198 A1* | 10/2016 | Edelen | | B41J 2/04541 |
| 2017/0028724 A1* | 2/2017 | Edelen | | B41J 2/1433 |
| 2018/0345667 A1* | 12/2018 | Edelen | | B41J 2/1433 |
| 2022/0297424 A1* | 9/2022 | Deboard | | B41J 2/14 |
| 2022/0297439 A1* | 9/2022 | Bergstedt | | B41J 2/04555 |
| 2023/0077341 A1* | 3/2023 | Bergstedt | | B41J 2/04555 |

FOREIGN PATENT DOCUMENTS

| | | | | |
|---|---|---|---|---|
| CN | 207683143 U | * | 8/2018 | |
| EP | 4059605 A2 | * | 9/2022 | ......... B41J 2/04541 |
| EP | 4059606 A1 | * | 9/2022 | ......... B41J 2/17566 |
| EP | 4147872 A1 | * | 3/2023 | |
| JP | 03284953 A | * | 12/1991 | |
| JP | 2009288009 A | * | 12/2009 | |
| KR | 950001101 B1 | * | 2/1995 | |

\* cited by examiner

FLUID SENSE CIRCUIT WITH VARIABLE SENSITIVITY

FIELD

This invention relates to a fluid sense circuit that is implemented on a microfluidic chip, and in particular to a fluid sense circuit having the ability to adjust the sensitivity of the circuit as a function of the chip supply voltage.

INTRODUCTION

Thermal inkjet technology has traditionally been used in the printing field, but is now finding expanded uses in areas such as drug delivery, micro-dosing, and dispensing into well plates. In cases where a sample fluid is added to a microfluidic chip by the user, it is important to be able to detect if the ejection chamber is properly primed before activation.

One method of determining if a fluidic chamber is filled is detecting the presence or absence of fluid in the chamber with a fluid sense cell that outputs a digital value representing the status of the chamber.

However, such a circuit does not have the ability to determine the type of fluid in the chamber, and may not even be able to determine if a highly electrically resistive fluid is present in the chamber, as the resistance of such a fluid may appear confusingly similar to the resistance of an empty chamber.

What is needed, therefore, is an ejection head design that tends to overcome issues such as those described above, at least in part.

SUMMARY

The present disclosure describes a circuit for determining the resistivity of a sample in the fluidic sense cell by adjusting a reference current in a non-linear fashion compared to the applied stimulus.

The above and other needs are met by a fluid dispensing system with a fluid cartridge having a fluid reservoir and an ejection head. The ejection head has fluid ejectors that are in fluid flow communication with the fluid reservoir. A fluid detection circuit is electrically connected to at least one of the fluid ejectors. The fluid detection circuit is configured to detect and characterize a fluid in the fluid ejector, where the fluid detection circuit characterizes the resistivity of the fluid by adjusting an ejector voltage of the at least one of the fluid ejectors.

In some embodiments according to this aspect of the disclosure, the fluid detection circuit exhibits a disproportionate bias voltage and reference current. In some embodiments, the fluid detection circuit is disposed on the ejection head. In some embodiments, the fluid detection circuit comprises a first electrode disposed within the at least one of the fluid ejectors, and a second electrode disposed within a fluid flow channel associated with the at least one of the fluid ejectors. In some embodiments, the fluid cartridge comprises more than one discrete fluid reservoirs. In some embodiments, the ejection head comprises more than one array of fluid ejectors and at least one fluid ejector from each of the arrays of fluid ejectors is associated with the fluid detection circuit. In some embodiments, one each of separate and independent fluid detection circuits is associated with one each of the fluid ejectors.

According to another aspect of the disclosure, there is described an ejection head having fluid ejectors and a fluid detection circuit electrically connected to at least one of the fluid ejectors. The fluid detection circuit is configured to detect and characterize a fluid in the fluid ejector, wherein the fluid detection circuit characterizes the resistivity of the fluid by adjusting an ejector voltage of the at least one of the fluid ejectors.

In various embodiments according to this aspect of the disclosure, the fluid detection circuit exhibits a disproportionate bias voltage and reference current. In some embodiments, the fluid detection circuit comprises a first electrode disposed within the at least one of the fluid ejectors, and a second electrode disposed within a fluid flow channel associated with the at least one of the fluid ejectors. In some embodiments, the ejection head comprises more than one array of fluid ejectors and at least one fluid ejector from each of the arrays of fluid ejectors is associated with the fluid detection circuit. In some embodiments, one each of separate and independent fluid detection circuits is associated with one each of the fluid ejectors.

According to yet another aspect of the present disclosure, there is described a method for dispensing a fluid with a fluid dispensing system. The fluid is provided in a fluid reservoir, and received from the fluid reservoir with a flow channel. The fluid is received from the flow channel with an ejection chamber. A fluid detection circuit is used to detect and characterize any of the fluid disposed between the flow channel and the ejection chamber. The fluid detection circuit detects the presence of and characterizes the resistivity of the fluid disposed between the flow channel and the ejection chamber by adjusting an ejector voltage of a fluid ejector disposed within the ejection chamber. A fluid dispense sequence is initiated when the fluid detection circuit detects the presence of the fluid between the flow channel and the ejection chamber.

In some embodiments according to this aspect of the disclosure, the fluid dispense sequence is modified when a fluid with an unexpected resistivity is detected in the ejection chamber. In some embodiments, the fluid dispense sequence is modified when no fluid is detected in the ejection chamber. In some embodiments, the fluid dispense sequence is terminated when no fluid is detected in the ejection chamber. In some embodiments, the fluid detection circuit exhibits a disproportionate bias voltage and reference current. In some embodiments, the fluid detection circuit comprises a first electrode disposed in the flow channel, and a second electrode disposed in the ejection chamber. In some embodiments, the ejection head comprises more than one array of ejection chambers and at least one ejection chamber from each array is associated with the fluid detection circuit. In some embodiments, the ejection head comprises multiple ejection chambers, and one each of separate and independent fluid detection circuits is associated with one each of the ejection chambers.

DRAWINGS

Further advantages of the disclosure are apparent by reference to the detailed description when considered in conjunction with the figures, which are not to scale so as to more clearly show the details, wherein like reference numbers indicate like elements throughout the several views, and wherein.

DESCRIPTION

Figure 1:
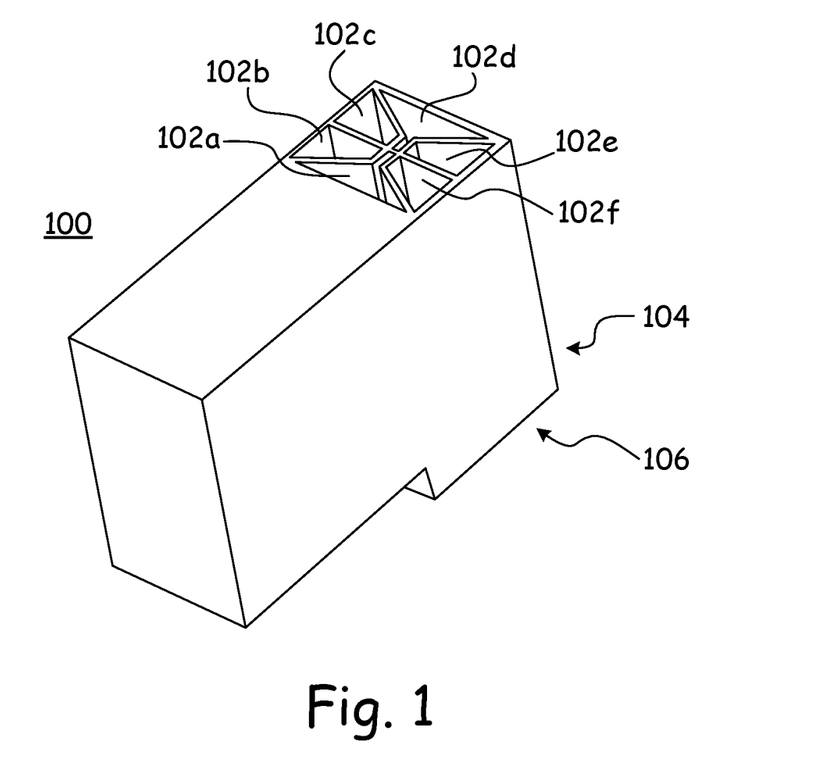
FIG. 1 is a perspective view of fluid cartridge according to an embodiment of the present disclosure.

With reference now to the figures, there is depicted in FIG. 1 a perspective view of a fluid cartridge 100 according to an embodiment of the present disclosure. In this embodiment, the cartridge 100 has a reservoir body 104 having six fluid reservoirs 102, but it is appreciated that in other embodiments the reservoir body 104 has other numbers of reservoirs 102, and the reservoirs 102 may be differently configured. The ejection head 200 (not explicitly depicted in FIG. 1) attaches in position 106 is this embodiment, but in other embodiments the ejection head 200 attaches in other locations, or is even separate from but in fluid communication with the reservoir body 104.

Figure 3:
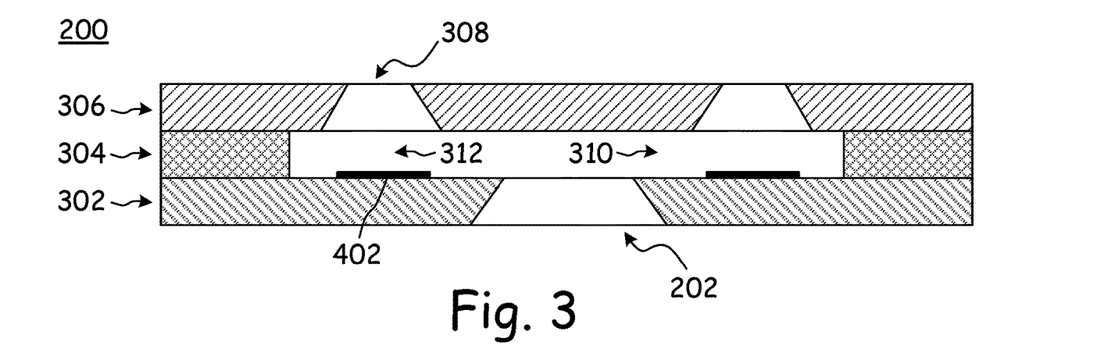
FIG. 3 is a cross-sectional view of an ejection head according to an embodiment of the present disclosure.

With reference now to FIG. 3, there is depicted is a cross-sectional view of an ejection head 200 according to an embodiment of the present disclosure. In this embodiment, the ejection head 200 includes three layers, which are the heater chip 302, the flow channel layer 304, and the nozzle plate layer 306. As depicted in FIG. 3, the chip 302 includes a via 202, which is in fluidic communication with a reservoir 102 of the reservoir body 104 (not depicted in FIG. 3). Thus, the via 202 provides the fluid to the other portions of the ejection head 200. The channel layer 304 includes flow channels 310, which communicate the fluid from the via 202 to an ejection chamber 312 that surrounds a fluid ejector 402 in the heat chip 302. The nozzle layer 306 includes nozzles 308 that are disposed above the ejection chambers 312 in the channel layer 304 and the fluid ejectors 402 on the chip 302, and through which the fluid is expressed when the fluid ejector 402 is energized.

It is appreciated that this description of the ejection head 200 is quite basic, but more detailed descriptions of the construction methods and materials that are used to fabricate ejection heads 200 are to be readily had elsewhere.

Figure 4:
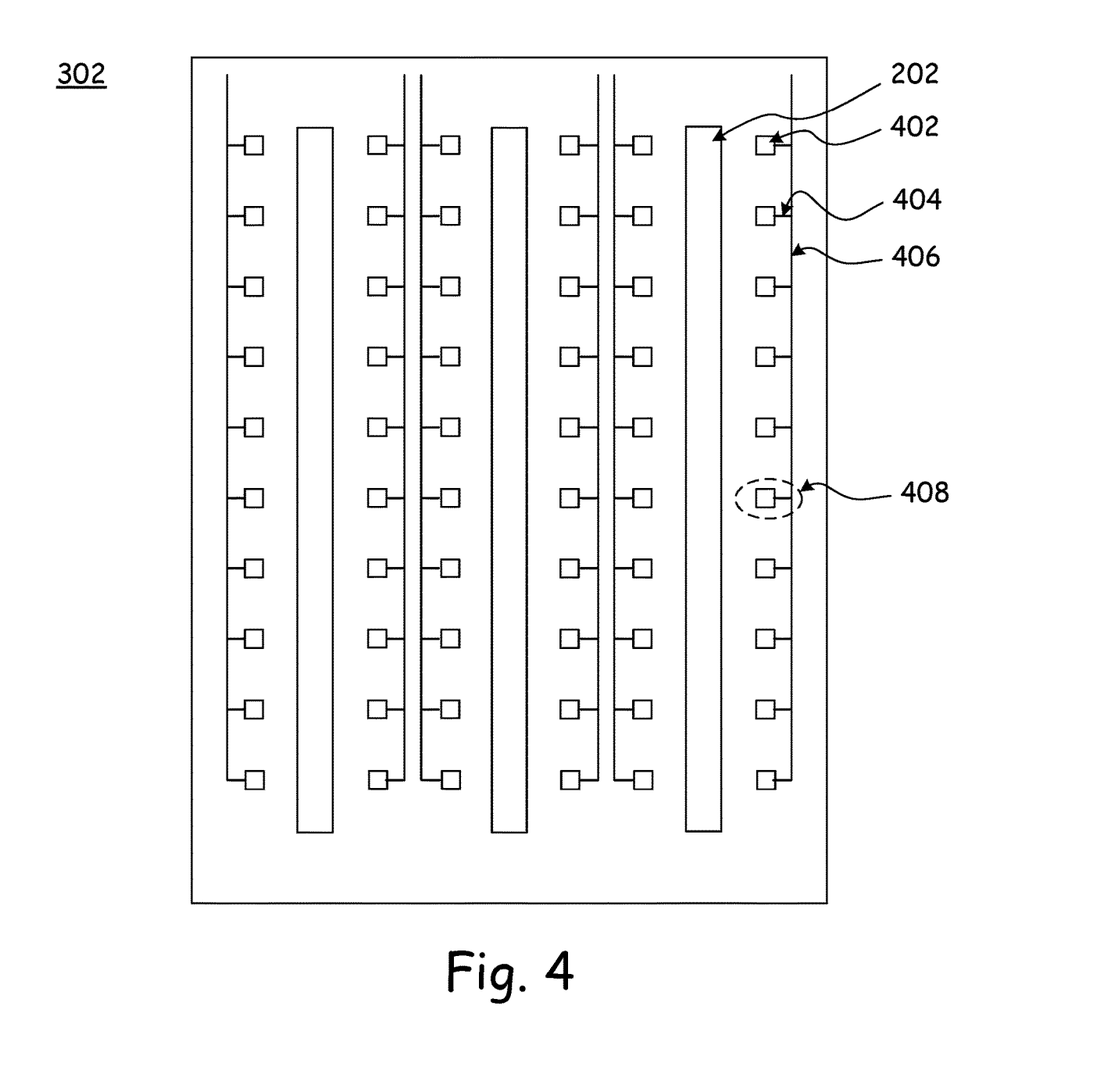
FIG. 4 is a plan view of a heater chip according to an embodiment of the present disclosure.

With reference now to FIG. 4, there is depicted a plan view of a heater chip 302 according to an embodiment of the present disclosure, including fluid ejectors 402, traces, 404, and vias zones 202. The electrically conductive traces 404 conduct electrical charges to the fluid ejectors 402. However, only some of these electrical traces 404 are depicted in FIG. 4, so as to not unnecessarily encumber the figure, and are not depicted at all in the other figures for similar reasons.

It is appreciated that the number and position of via zones 202, fluid ejectors 402, and traces 404 are only representative in the figures, and that in other embodiments there are different numbers, positions, and arrangements of the via zones 202, the fluid ejectors 402, and traces 404.

Figure 2:
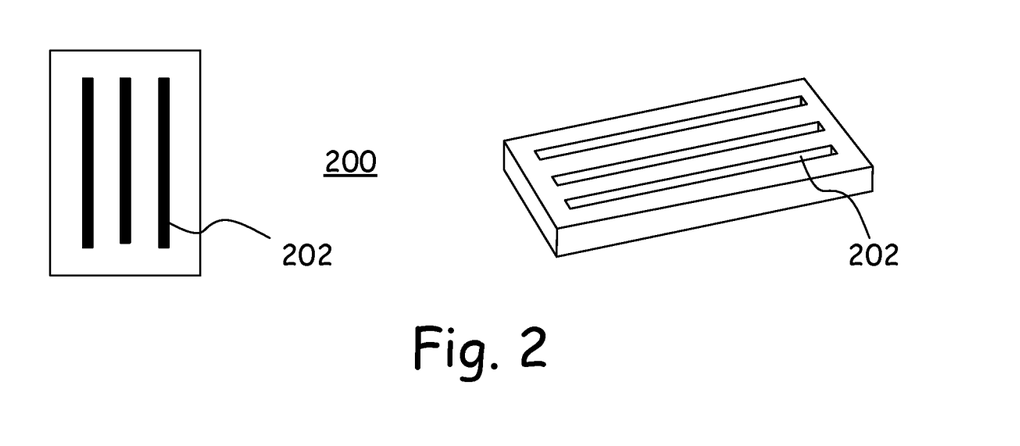
FIG. 2 is plan and perspective views of fluid ejection heads according to embodiments of the present disclosure.
Figure 5:
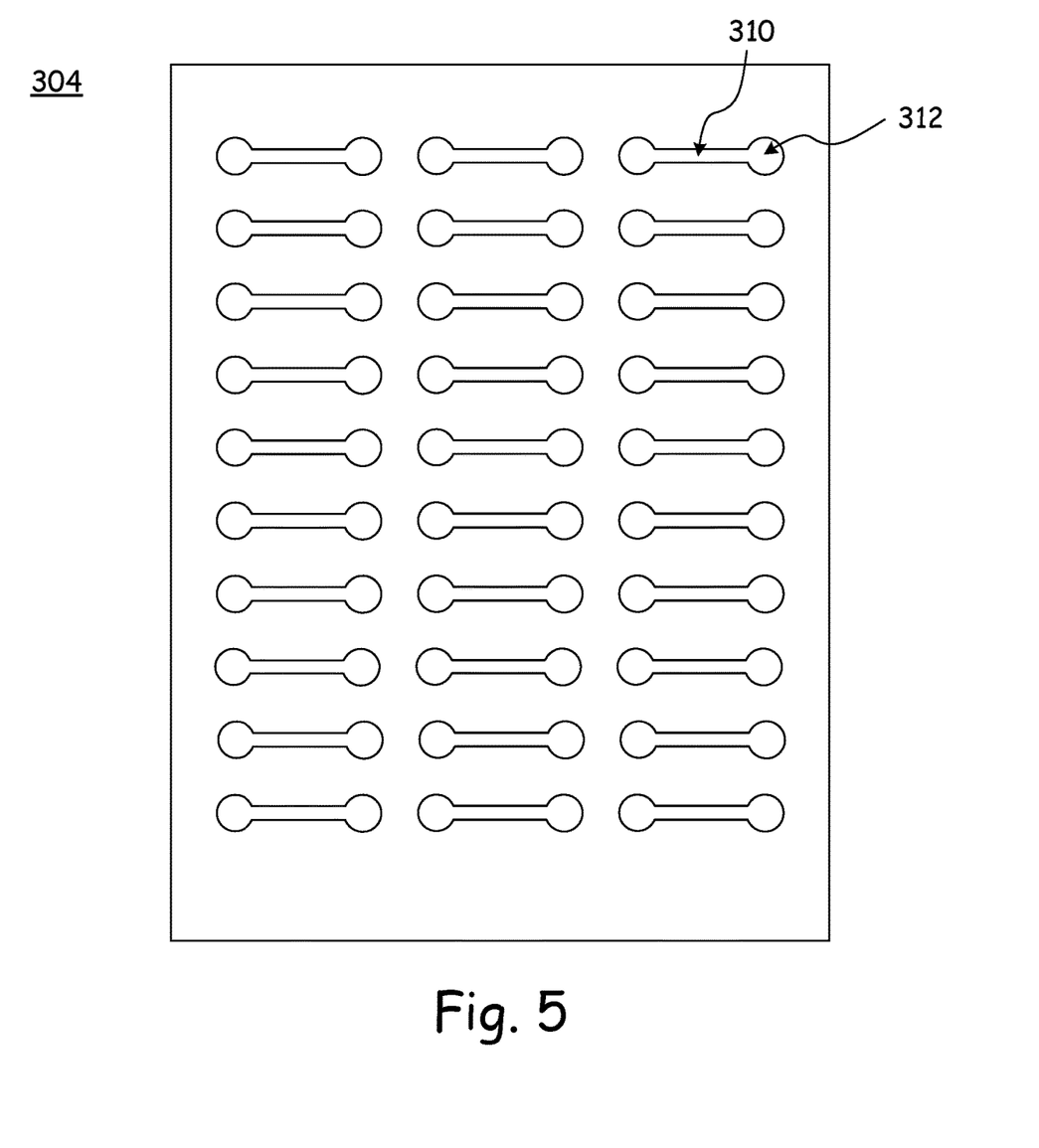
FIG. 5 is a plan view of a channel layer according to an embodiment of the present disclosure.
Figure 6:
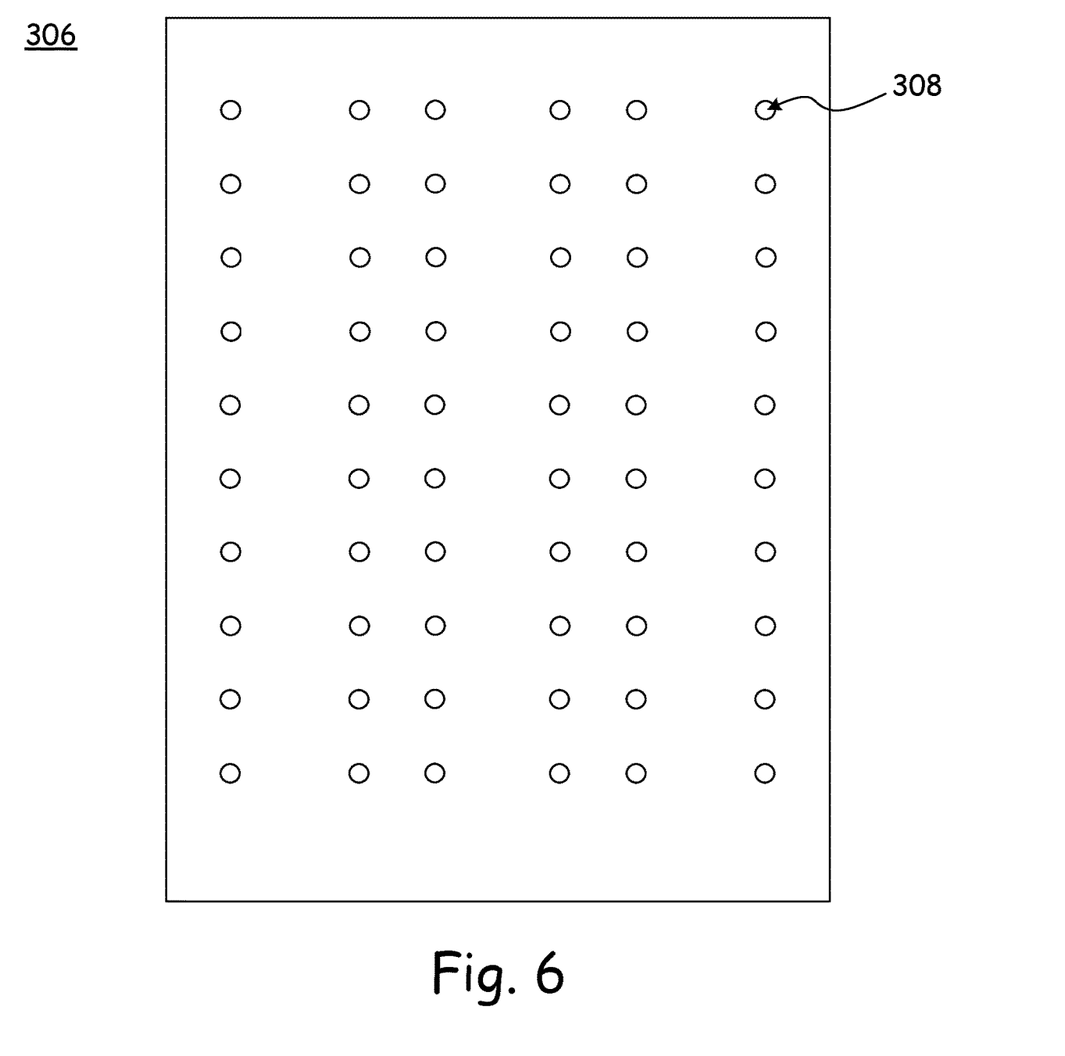
FIG. 6 is a plan view of a nozzle layer according to an embodiment of the present disclosure.

FIG. 2 depicts plan and perspective views of the ejection head 200 according to various embodiments of the present disclosure, from the bottom of the chip 302. FIG. 5 depicts a channel layer 304 that is used with the chip 302 of FIG. 4, depicting flow channels 310 and ejection chambers 312. FIG. 6 depicts a nozzle plate layer 306 that is used with the chip 302 of FIG. 4, depicting nozzles 308.

Figure 7A:
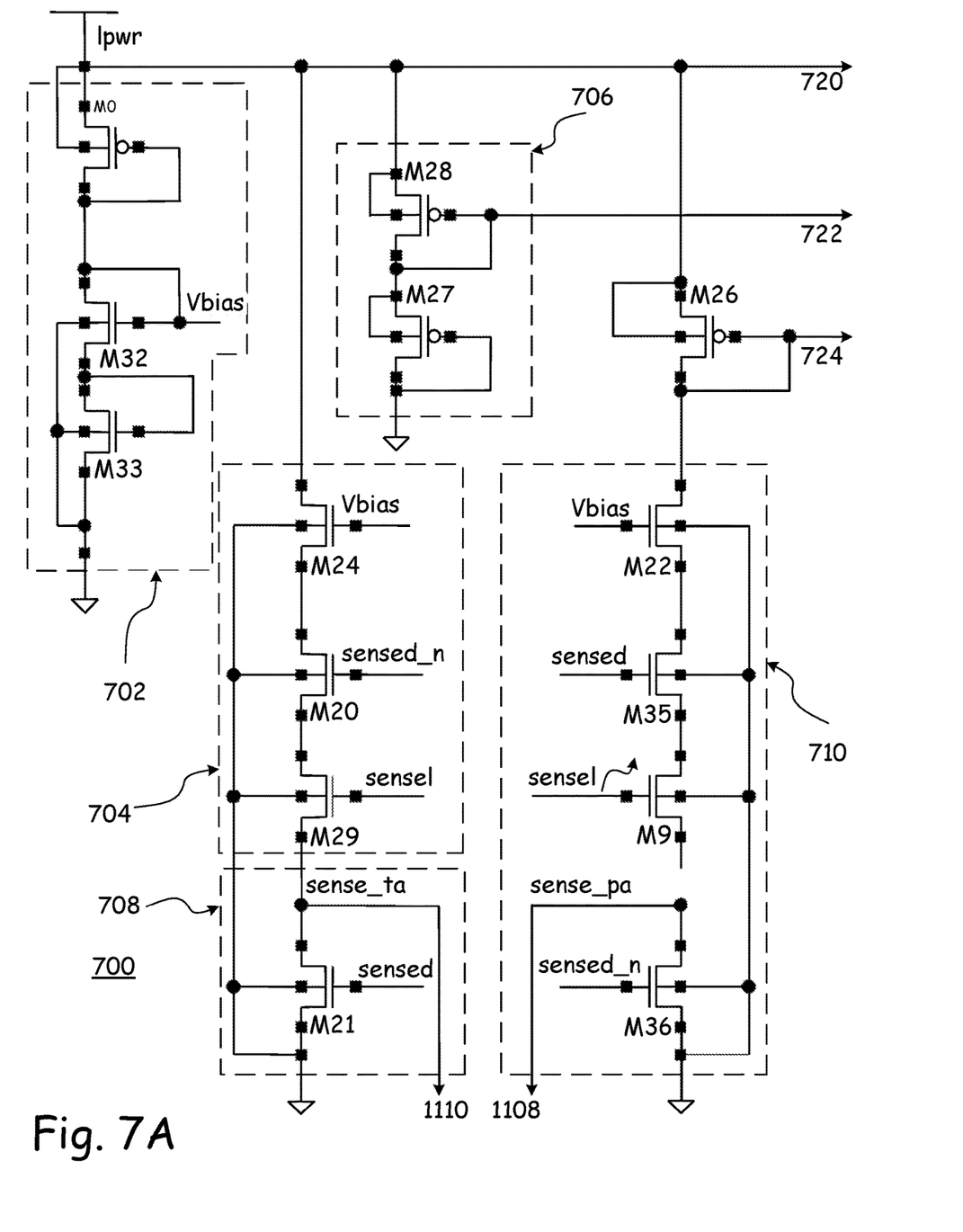
FIGS. 7A and 7B are schematic representations of a fluid sense circuit according to an embodiment of the present disclosure.
Figure 7B:
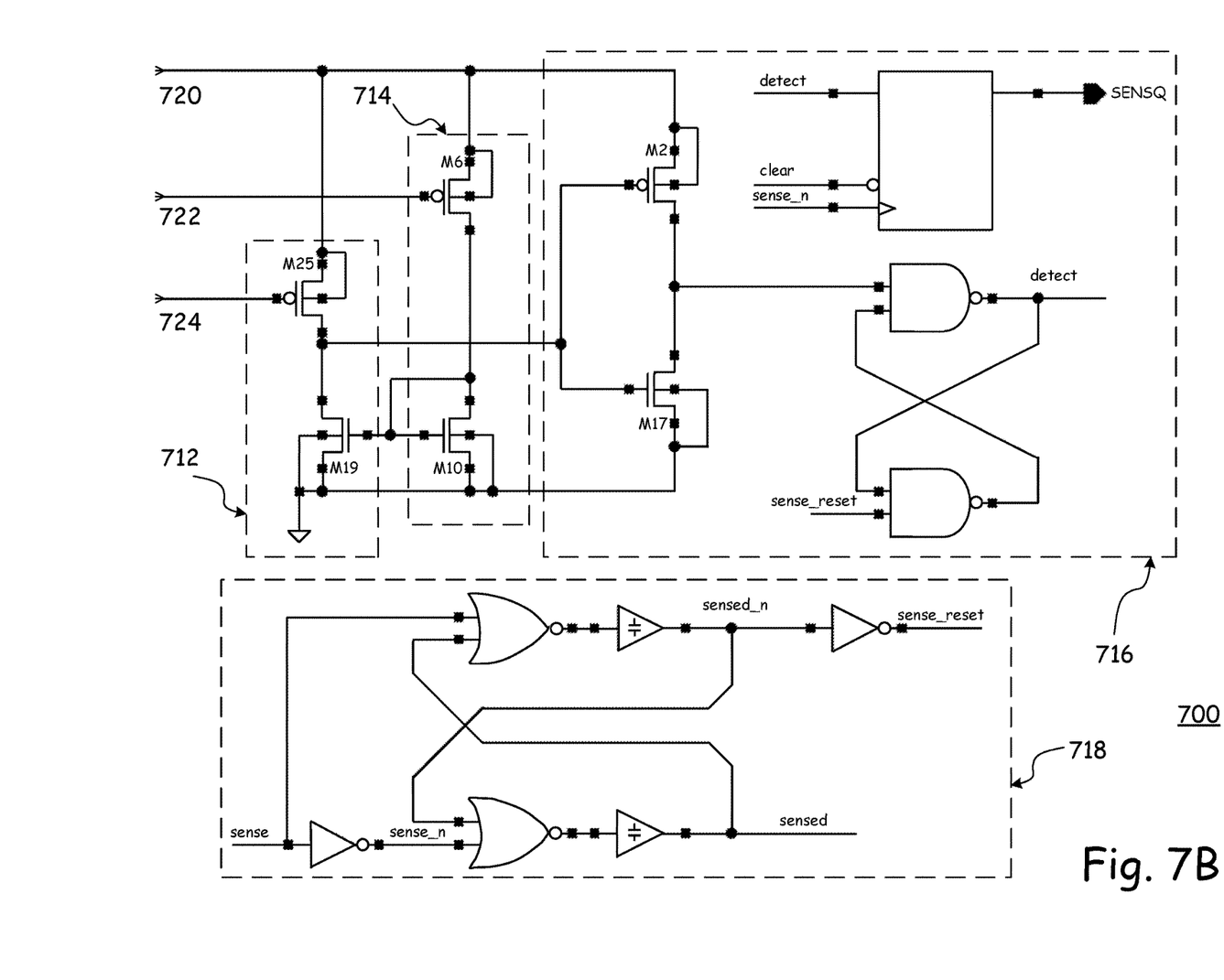

As depicted in FIG. 4, position 408 depicts one embodiment of a location of an electrical circuit 700, as depicted in FIGS. 7A and 7B, that is adapted to determine whether the flow channels 310 and ejection chambers 312 are filled with a fluid or not, as described in greater detail hereafter. Multiple copies of the circuit 700 can be placed in association with each of the fluid ejectors 402 or just some of the fluid ejectors 402, in various embodiments.

Figure 11:
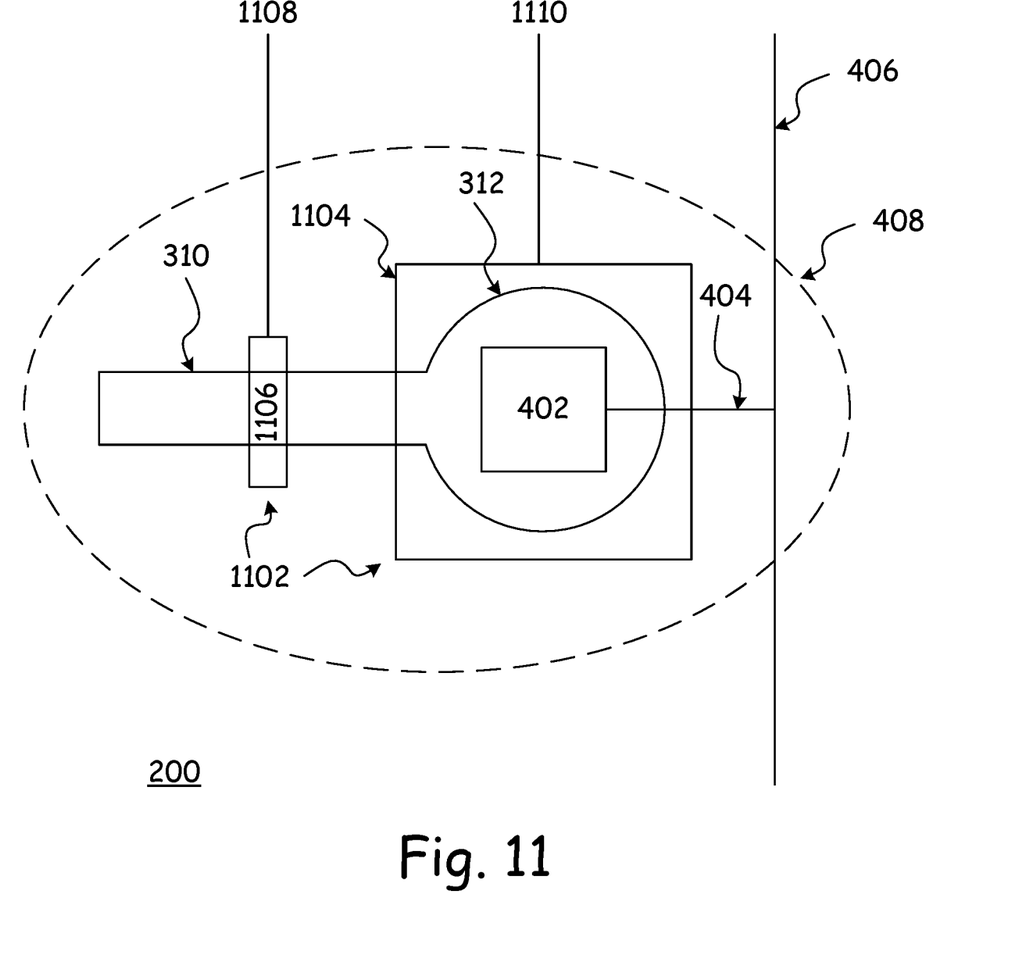
FIG. 11 is a plan view of a fluid sense circuit according to an embodiment of the present disclosure.

In order to determine if the ejection chambers 312 contain fluid, a fluid conductivity detection circuit 700 can be placed, in one embodiment, in location 408 as depicted in greater detail in FIG. 11. A conductivity detection device 1102 is illustrated in a simplified plan view, containing electrodes 1104 and 1106. Electrode 1104 may be disposed over the fluid ejector 402. A second electrode 1106 is disposed across the fluid channel 310. These two electrodes 1104 and 1106 are electrically connected to leads 1110 and 1108, respectively. These leads 1110 and 1108 are also labeled in FIG. 7A. Each of the electrodes 1104 and 1106 may be made of a metal, such as tantalum, that is resistant to the fluids dispensed by the digital dispense device 200.

The first electrode 1104 and the second electrode 1106 are electrically connected one to another when there is a conductive fluid in the flow channel 310. When a conductive liquid is not present in the flow channel 310, then there is an open circuit between the two electrodes 1104 and 1106. By applying various bias voltages to the electrodes 1104 and 1106, and comparing sensed voltages and currents, the presence of a liquid in the flow channel 310 can be detected, and some of the properties of that liquid can be determined.

With reference now to FIGS. 7A and 7B, there are depicted six main parts of the circuit 700, including the reference current circuit 706 and 714, the bias voltage reference 702, the sense switch and bias voltage limiter 704, 708, and 710, the clock signal generator 718, the current comparator 712, and the output latch and register 716. Each of these circuits is described in more detail below. Lines 720, 722, and 724 indicate the electrical connections between the arbitrarily-divided depictions of the circuit 700 in FIGS. 7A and 7B.

The reference current circuit 706 and 714 generates a reference current that tracks with the VPWR voltage, and is widely adjustable. This allows for sensitivity adjustments for fluids that have different equivalent resistances, and provides a balance between noise immunity and sensitivity.

The bias voltage circuit 702 generates a voltage reference for the sense elements 704, 708, and 710, and has a limiting behavior to make the bias voltage more constant with varying VPWR voltage. This allows the sense elements 704, 708, and 710 voltage to be maximized without exceeding a desired limit, as large bias voltages may damage the sense elements 704, 708, and 710 and prevent accurate detection of liquids.

The sense switches 704, 708, and 710 and the Vbias limiter control switch phases of the reference phase and compare the phase. In the reference phase, the pad is limited to the Vbias voltage, while in the compare phase the pad is connected to LGND. The sense pad is connected and limited to the Vbias voltage by lead 1108 as given in FIG. 7A, in both the compare phase and the reference phase.

The clock generation circuit 718 generates non-overlapping clock signals. The reference phase signals and the compare phase signals are break-before-make type signals. This helps control sensor charging by making the sensor elements 704, 708, and 710 stabilize before comparison.

The current comparator circuit 712 detects by subtracting the reference current from the fluid sensed current in the compare phase. If the comparison voltage is greater than zero, then a fluid has been detected.

The output latch and register circuit 716 latches the detected comparison, and is then resettable for the next comparison operation. The output register holds the detection result until a new comparison is complete.

Figure 8:
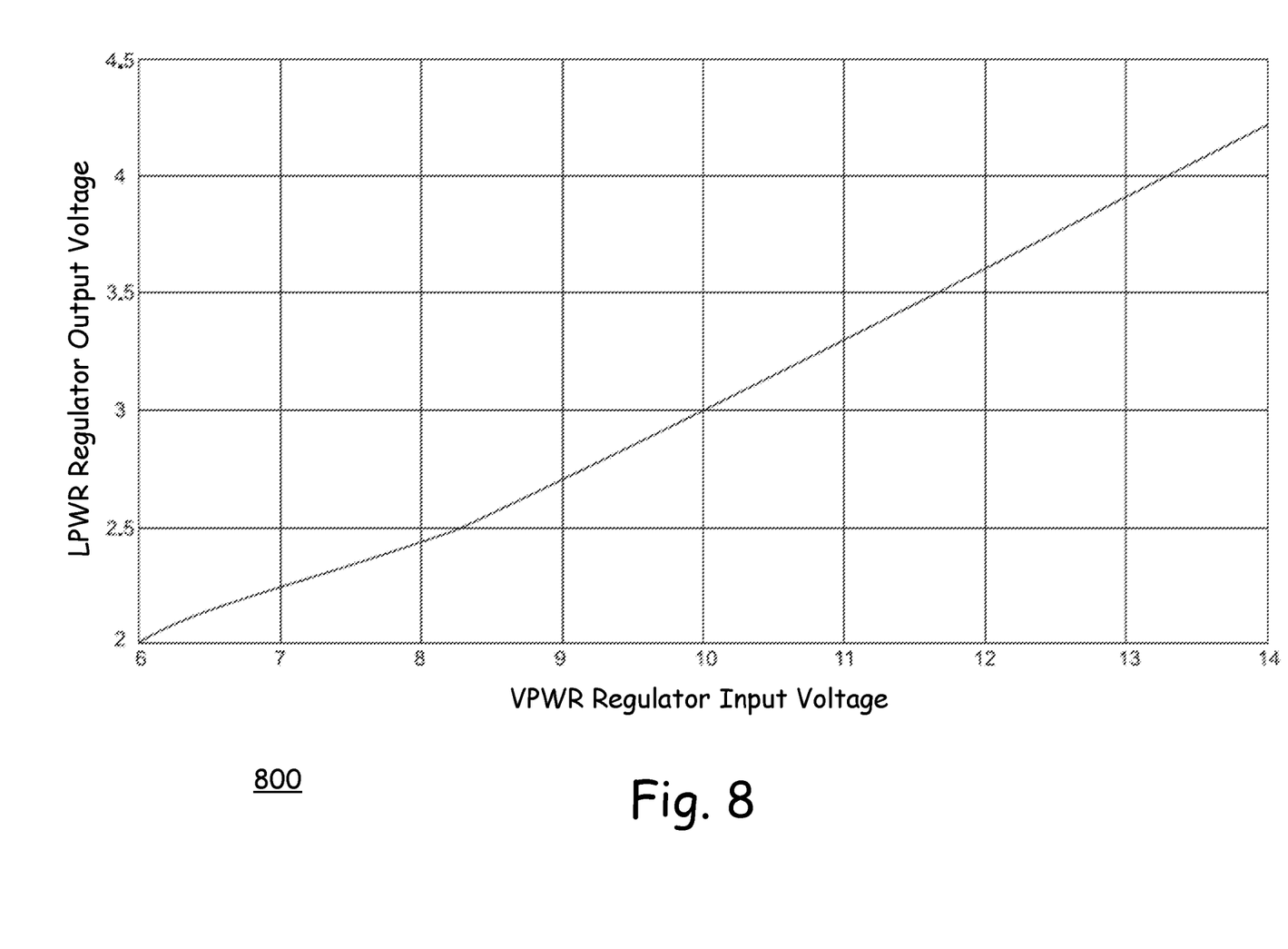
FIG. 8 is a chart of the relationship between the applied voltage and the ejector voltage, according to an embodiment of the present disclosure.

FIG. 8 shows a chart 800 of the relationship between the microfluidic chip ejector voltage and the internally generated voltage applied to the VDD of the fluid sense circuit. As shown, by adjusting the ejector voltage (VPWR) the circuit voltage (LPWR) can be nearly linearly varied.

Figure 9:
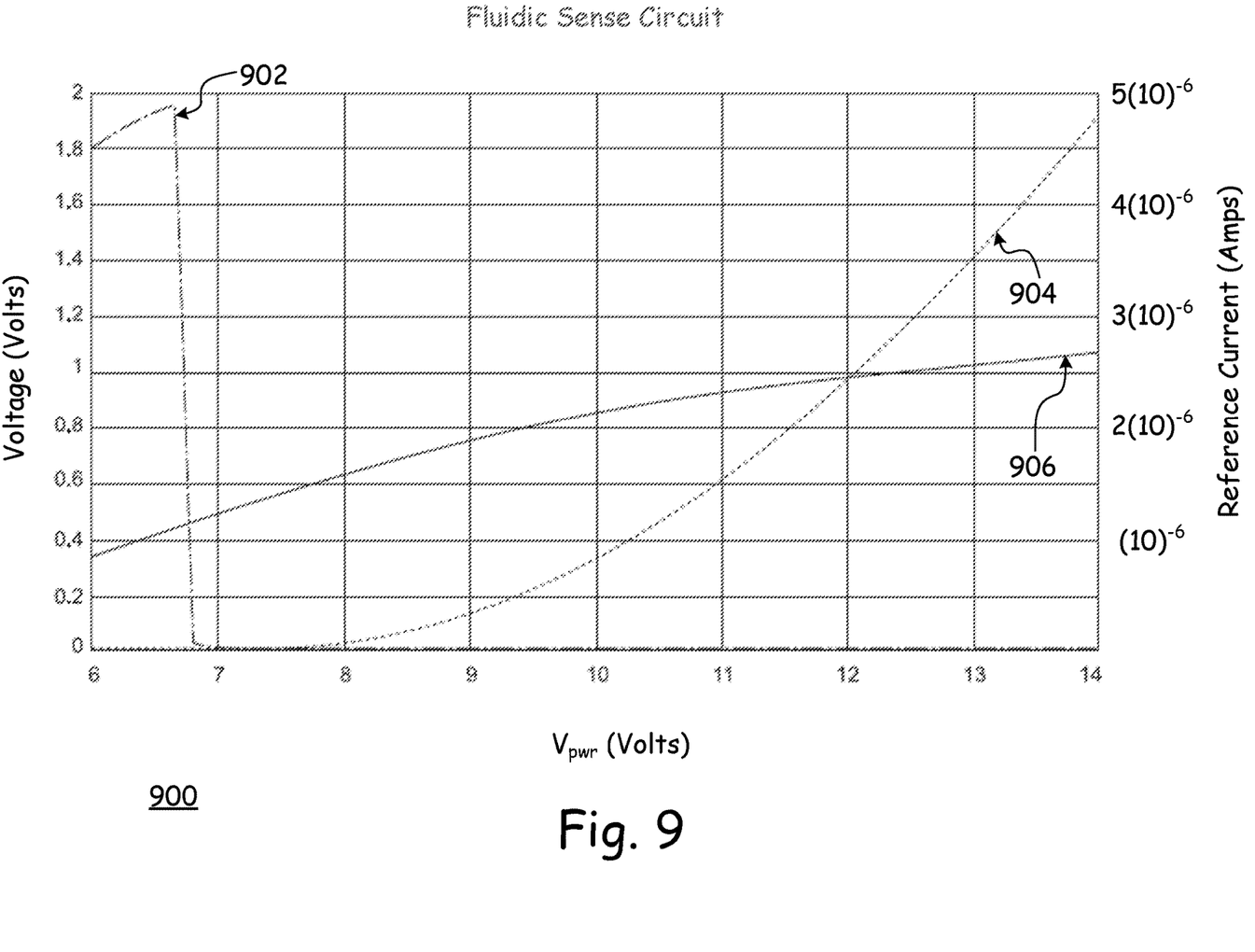
FIG. 9 is a chart of the relationship between the bias voltage and the reference current as the VPWR voltage is reduced, according to an embodiment of the present disclosure.

FIG. 9 shows a chart 900 of the relationship between the sensed output voltage depicted as trace 902 (with voltage measured on the left-hand ordinate axis), the bias voltage depicted as trace 906, and the reference current 904 (with amperage measured on the right-hand ordinate axis) as the VPWR voltage (as measured on the abscissa) is reduced. The significant benefit to the circuit is that when the VPWR is reduced from about 12V to about 9V, the bias voltage 906 follows in a roughly linear fashion from about 980 mV to about 765 mV, but the reduction in the reference current 904 is non-linear from about 2420 nA to about 319 nA. This represents about a 22% reduction in the bias voltage 906 as compared to about a 87% reduction in the reference current 904, in this example. The disproportionate bias to reference produces a larger signal in the fluidic sense cell 700, while reducing the sense point.

Figure 10:
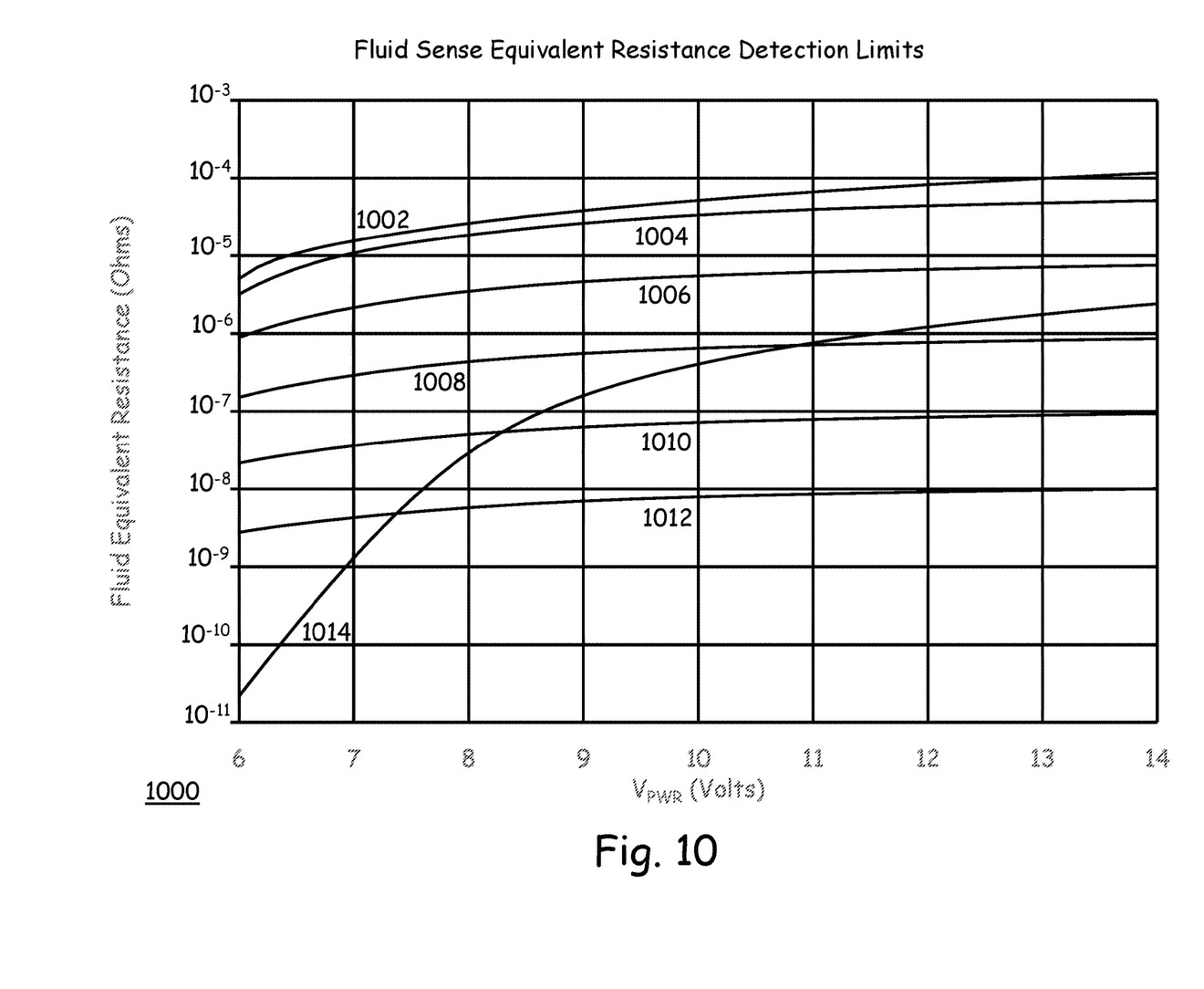
FIG. 10 is a chart of the relationship between the VPWR settings and the fluid resistance detection range according to an embodiment of the present disclosure.

FIG. 10 shows a chart 1000 of the testing capabilities of the circuit 700 for several different fluids 1002-1012 that might be used in the ejection head 200. The fluids 1002-1012 have different resistivities, with fluid 1002 having the highest resistivity and fluid 1012 having the lowest resistivity. The resistivity for each fluid 1002-1012 is plotted as a function of VPWR, from about 6 volts through about 14 volts.

Also plotted on chart 1000 is the reference current 1014 and various VPWR settings. At any point along the VPWR scale, the circuit 700 is able to detect and characterize the resistance of a fluid 1002-1012 that has a resistance about the plotted reference current 1014. Thus, at about 12 volts, for this embodiment, the circuit 700 is able to detect and characterize fluids 1002-1006. At about 7 volts, the circuit 700 might be able to detect and characterize all of the fluids 1002-1012.

Novel aspects of the invention over cited prior art include a fluid detection circuit 700 with disproportionate bias voltage and reference current, and the ability to determine fluid resistivity by lowering the microfluidic chip ejector voltage.

The foregoing description of embodiments for this disclosure has been presented for purposes of illustration and description. It is not intended to be exhaustive or to limit the disclosure to the precise form disclosed. Obvious modifications or variations are possible in light of the above teachings. The embodiments are chosen and described in an effort to provide illustrations of the principles of the disclosure and its practical application, and to thereby enable one of ordinary skill in the art to utilize the disclosure in various embodiments and with various modifications as are suited to the particular use contemplated. All such modifications and variations are within the scope of the disclosure as determined by the appended claims when interpreted in accordance with the breadth to which they are fairly, legally, and equitably entitled.

The invention claimed is:

1. A fluid dispensing system comprising: a fluid cartridge having a fluid reservoir and an ejection head, the ejection head having fluid ejectors, wherein the fluid ejectors are in fluid flow communication with the fluid reservoir, and a fluid detection circuit electrically connected to at least one of the fluid ejectors, the fluid detection circuit configured to detect and characterize a fluid in the fluid ejector, wherein the fluid detection circuit is controlled by adjusting an applied voltage to the fluid detection circuit to change a reference current, thereby enabling the fluid detection circuit to detect fluids of different characteristic resistivity, and further wherein the fluid detection circuit is configured to exhibit a disproportionate bias voltage and reference current.

2. The fluid dispensing system of claim 1, wherein the fluid detection circuit is disposed on the ejection head.

3. The fluid dispensing system of claim 1, wherein the fluid detection circuit comprises a first electrode disposed within the at least one of the fluid ejectors, and a second electrode disposed within a fluid flow channel associated with the at least one of the fluid ejectors.

4. The fluid dispensing system of claim 1, wherein the fluid cartridge comprises more than one discrete fluid reservoirs.

5. The fluid dispensing system of claim 1, wherein the ejection head comprises more than one array of fluid ejectors and at least one fluid ejector from each of the arrays of fluid ejectors is associated with the fluid detection circuit.

6. The fluid dispensing system of claim 1, wherein one each of separate and independent fluid detection circuits is associated with one each of the fluid ejectors.

7. An ejection head comprising: fluid ejectors, and a fluid detection circuit electrically connected to at least one of the fluid ejectors, the fluid detection circuit configured to detect and characterize a fluid in the fluid ejector, wherein the fluid detection circuit is controlled by adjusting an applied voltage to the fluid detection circuit to change a reference current, thereby enabling the fluid detection circuit to detect fluids of different characteristic resistivity, and further wherein the fluid detection circuit is configured to exhibit a disproportionate bias voltage and reference current.

8. The ejection head of claim 7, wherein the fluid detection circuit comprises a first electrode disposed within the at least one of the fluid ejectors, and a second electrode disposed within a fluid flow channel associated with the at least one of the fluid ejectors.

9. The ejection head of claim 7, wherein the ejection head comprises more than one array of fluid ejectors and at least one fluid ejector from each of the arrays of fluid ejectors is associated with the fluid detection circuit.

10. The ejection head of claim 7, wherein one each of separate and independent fluid detection circuits is associated with one each of the fluid ejectors.

11. A method for dispensing a fluid with a fluid dispensing system, comprising: providing the fluid in a fluid reservoir, receiving the fluid from the fluid reservoir with a flow channel, receiving the fluid from the flow channel with an ejection chamber, using a fluid detection circuit to detect and characterize any of the fluid disposed between the flow channel and the ejection chamber, wherein the fluid detection circuit is controlled by adjusting an applied voltage to the fluid detection circuit to change a reference current, thereby enabling the fluid detection circuit to detect fluids of different characteristic resistivity, wherein the fluid detection circuit is configured to exhibit a disproportionate bias voltage and reference current, and initiating a fluid dispense sequence when the fluid detection circuit detects the presence of the fluid between the flow channel and the ejection chamber.

12. The method of claim 11, further comprising modifying the fluid dispense sequence when a fluid with an unexpected resistivity is detected in the ejection chamber.

13. The method of claim 11, further comprising modifying the fluid dispense sequence when no fluid is detected in the ejection chamber.

14. The method of claim 11, further comprising terminating the fluid dispense sequence when no fluid is detected in the ejection chamber.

15. The method of claim 11, wherein the fluid detection circuit comprises a first electrode disposed in the flow channel, and a second electrode disposed in the ejection chamber.

16. The method of claim 11, wherein the ejection head comprises more than one array of ejection chambers and at least one ejection chamber from each array is associated with the fluid detection circuit.

17. The method of claim 11, wherein the ejection head comprises multiple ejection chambers, and one each of separate and independent fluid detection circuits is associated with one each of the ejection chambers.

* * * * *